(12) United States Patent
Park et al.

(10) Patent No.: US 9,831,221 B2
(45) Date of Patent: Nov. 28, 2017

(54) LIGHT EMITTING DEVICE PACKAGE AND LIGHTING APPARATUS INCLUDING THE SAME

(71) Applicant: LG INNOTEK CO., LTD., Seoul (KR)

(72) Inventors: Gwui Youn Park, Seoul (KR); Bo Ra Kang, Seoul (KR); Sung Phil Kim, Seoul (KR); Yang Hyun Joo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/614,004

(22) Filed: Feb. 4, 2015

(65) Prior Publication Data

US 2015/0221620 A1 Aug. 6, 2015

(30) Foreign Application Priority Data

Feb. 5, 2014 (KR) .................. 10-2014-0013149

(51) Int. Cl.
| | |
|---|---|
| *H01L 25/075* | (2006.01) |
| *H01L 33/48* | (2010.01) |
| *H01L 33/54* | (2010.01) |
| *H01L 33/56* | (2010.01) |
| *H01L 33/58* | (2010.01) |
| *H01L 33/50* | (2010.01) |

(52) U.S. Cl.
CPC ........ *H01L 25/0753* (2013.01); *H01L 33/486* (2013.01); *H01L 33/54* (2013.01); *H01L 33/56* (2013.01); *H01L 33/58* (2013.01); *H01L 33/507* (2013.01); *H01L 2924/0002* (2013.01)

(58) Field of Classification Search
CPC .............. F21Y 2115/10; F21Y 2113/13; F21Y 2103/10
See application file for complete search history.

(56) References Cited

U.S. PATENT DOCUMENTS

2004/0223315 A1* 11/2004 Suehiro ................. H01L 33/507
362/84
2015/0117020 A1* 4/2015 Hata ................... H01L 25/0753
362/294

FOREIGN PATENT DOCUMENTS

| KR | 10-2010-0134912 A | 12/2010 |
|---|---|---|
| KR | 1020100134912 | * 12/2010 |
| KR | 10-2013-0084803 A | 7/2013 |

* cited by examiner

*Primary Examiner* — Tony Tran
(74) *Attorney, Agent, or Firm* — Ked & Associates, LLP

(57) ABSTRACT

A light emitting device package includes: a light emitting device disposed on a substrate; a diffusion plate disposed on the substrate to surround the light emitting device; and a molding portion that is disposed on the substrate and has a shape of an aspheric lens whose center is recessed, The center of the molding portion is located on the same axis as the center of the light emitting device, and the diffusion plate may be interposed between the light emitting device and the molding portion. The molding portion having the shape of the aspheric lens whose center is recessed and the diffusion plate are employed to widely diffuse the light emitted from the light emitting device. Thereby, the efficiency of light can be increased, and manufacturing time and cost can be reduced. Simultaneously, a yellow ring phenomenon can be avoided.

13 Claims, 5 Drawing Sheets

LIGHT EMITTING DEVICE PACKAGE AND LIGHTING APPARATUS INCLUDING THE SAME

CROSS-REFERENCE TO RELATED APPLICATION

This application claims priority under 35 U.S.C. §119 to Korean Patent Application No. 10-2014-0013149, filed on Feb. 5, 2014, whose entire disclosure is hereby incorporated by reference.

BACKGROUND

1. Field

The present disclosure relates to a light emitting device package and a lighting apparatus including the same.

2. Background

Light emitting devices such as a light emitting diode (LED) are classified as a semiconductor device that converts electric energy into light by means of a P-N junction structure of a compound semiconductor. The light emitting devices get into the spotlight as a next generation light source due to low power consumption, an extended life, and a possibility of reducing a size and weight. Recently, blue LEDs and ultra violet LEDs realized using a nitride having excellent physical and chemical properties have shown up. White light or other types of monochromatic light can be obtained by the blue or ultra violet LED and a fluorescent substance, and thereby the applications of the light emitting devices become wider.

Flat panel lighting apparatuses can be formed using the light emitting devices. At this time, light emitted from the light emitting devices should be widely diffused in order to reduce the number of the light emitting devices required. Thus, a secondary lens may be additionally mounted to widen a diffusion range of the light emitted from the light emitting devices. However, the addition of the lens leads not only to reducing efficiency of light but also to increasing manufacturing time and cost.

BRIEF DESCRIPTION OF THE DRAWINGS

The embodiments will be described in detail with reference to the following drawings in which like reference numerals refer to like elements wherein.

DETAILED DESCRIPTION

Figure 1A:
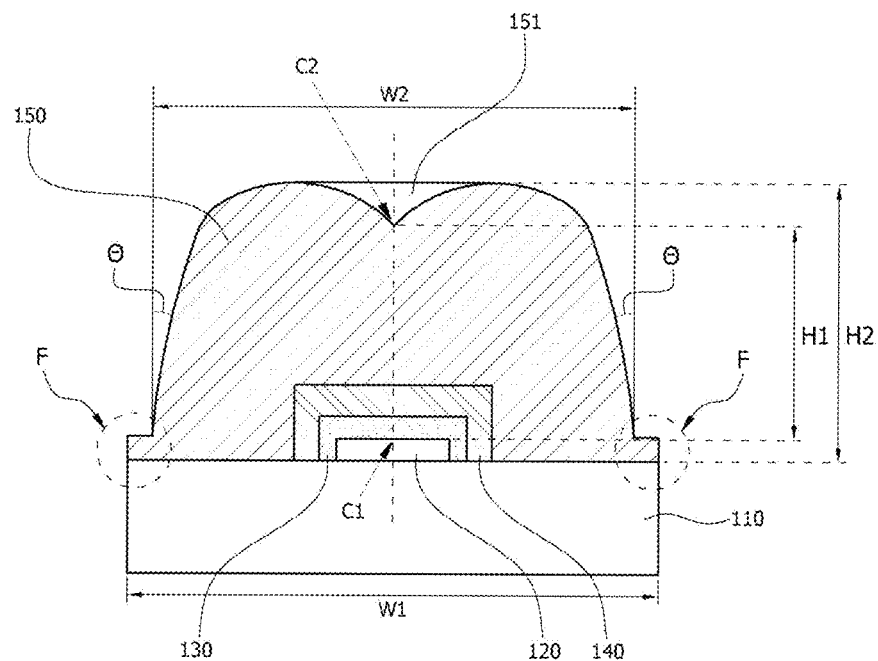
FIG. 1A is a cross sectional view illustrating a light emitting device package according to a first embodiment of the present disclosure.

The present disclosure may have various embodiments, and specific embodiments of the present disclosure will be exemplary shown in drawings and described below. However, these specific embodiments are for illustration only, but not meant to limit the disclosure. Various changes and modifications, which can be easily devised by technician familiar with the fields of the disclosure having benefit of this description, are contemplated as being within the scope of the disclosure.

Unless otherwise defined, terms used herein have the same meanings as those generally understood by those with ordinary knowledge in the field of art to which the disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present application.

When a component is mentioned to be "connected" to or "accessing" another component, this may mean that it is directly connected to or accessing the other component, but it is to be understood that another component may exist in-between. On the other hand, when a component is mentioned to be "directly connected" to or "directly accessing" another component, it is to be understood that there are no other components in-between.

The terms used in the present application are merely used to describe particular embodiments, and are not intended to limit the disclosure. An expression used in the singular encompasses the expression of the plural, unless it has a clearly different meaning in the context. In the present application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

In addition, although description may be occasionally omitted with respect to overlapping matters, this does not limit the gist of the present disclosure. Meanwhile, in the following description, the same elements will be designated by the same reference numerals although they are shown in different drawings.

Figure 1B:
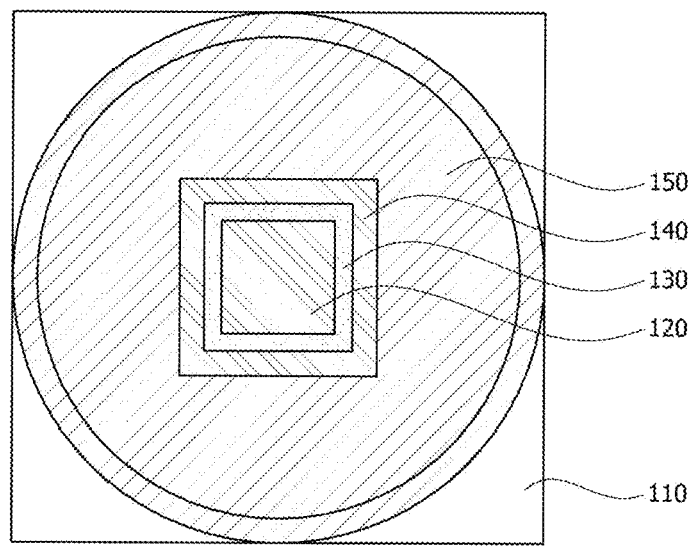
FIG. 1B is a plan view illustrating a light emitting device package according to the first embodiment of the present disclosure.

FIG. 1A is a cross sectional view illustrating a light emitting device package according to a first embodiment of the present disclosure, and FIG. 1B is a plan view illustrating the light emitting device package according to the first embodiment of the present disclosure. Specifically, FIG. 1A is a cross-sectional view in a direction perpendicular to a main surface of a substrate and FIG. 1B is a plan view in a direction parallel to the main surface of the substrate.

Referring to FIGS. 1A and 1B, the light emitting device package according to the first embodiment of the present disclosure may include a light emitting device 120 disposed on a substrate 110, a diffusion plate 140 disposed on the substrate 110 to surround the light emitting device 120, a florescent substance layer 130 interposed between the light emitting device 120 and the diffusion plate 140, and a molding portion 150 that is disposed on the substrate 110 including the diffusion plate 140 and has a shape of an aspheric lens.

The substrate 110 may be a typical printed circuit board (PCB) or lead frame. In addition of such a material, the substrate 110 may be formed of any one of alumina, quartz, zirconia, forsterite, cordierite, beryllia, mullite, calcium zirconate, silicon carbide, aluminium nitride, fused silica, LTCC (Low Temperature Co-fired Ceramic), plastic, graphite, and metal.

The light emitting device 120 may be a device that emits light by re-combination of minority carriers (electrons or holes) injected using a P-N junction structure of a chemical semiconductor, and may be a light emitting diode (LED). Although not shown in these figures, the light emitting device 120 may be electrically connected to electrodes of the substrate 110 by, for instance, wires, and be supplied with power.

The florescent substance layer 130 may absorb a part of the light emitted from the light emitting device 120 to emit light whose wavelength is different from that of absorbed light. The florescent substance layer 130 may include a florescent substance composed of active ions and have introduced impurities at appropriate positions of a host lattice. The active ions determine a color of emitted light by determining a energy level involved in a light emitting process. The color of the emitted light may be determined by an energy gap between a ground state and an exited state of the active ions in a crystalline structure. Meanwhile, the florescent substance layer 130 may be made by injecting at least one of a red florescent substance, a blue florescent substance, a green florescent substance, or a yellow florescent substance into a transparent resin such as a silicone resin.

The diffusion plate 140 allows light to be uniformly emitted by scattering and diffusing the light emitted from the light emitting device 120, and may include an opal series diffuser such as barium titanate, titanium dioxide, aluminium oxide, silicon dioxide. Meanwhile, a so-called yellow ring phenomenon in which a yellow circle is shown at an edge of the emitted light is present in a lighting apparatus using a conventional light emitting device. The diffusion plate 140 functions to prevent the yellow ring phenomenon from occurring.

The molding portion 150 may have an aspheric shape having a recess 151 at the center thereof as a lens-integrated package that has a function of protecting the light emitting device 120 and a function of a lens. The center C2 of the molding portion 150 and the center C1 of the light emitting device 120 may be disposed on the same axis. A lower end of the molding portion 150 may be provided with a flange region F that protrudes radially outward, and thus a width W1 of the lower end of the molding portion 150 may be wider than a width W2 of an upper end of the molding portion 150. For example, the width W1 of the lower end of the molding portion 150 may be a range of 2.97 mm to 3.03 mm, and the width W2 of the upper end of the molding portion 150 may be a range of 2.77 mm to 2.83 mm. Further, a height H1 from an upper surface of the light emitting device 120 to the center C2 of the molding portion 150 should be equal to or greater than 0.5 mm, and smaller than a height H2 of the molding portion 150 which is, for example, 0.95 mm to 1.01 mm. Meanwhile, an angle θ between a surface perpendicular to a main surface of the substrate 110 and a lateral surface of the molding portion 150 may be 1° to 60°. The molding portion 150 may be formed of a transparent or semi-transparent resin, such as a silicone resin or an epoxy resin, because the light emitted from the light emitting device 120 should be transmitted outside.

Particularly, a shape of a lens surface of the molding portion 150, which is in rotational symmetry with respect to a light axis, may be conveniently defined in a cylindrical coordinate system having a z-axis set as an axis of rotational symmetry of the lens surface, and may be expressed as a set of points x and y defining the lens surface of the molding portion 150. Herein, x is an axial radius measured on the axis perpendicular to the light axis, and y is a step of the lens surface in the axial radius x. At this time, the step of the lens surface means a height obtained by measuring an apex of the molding portion 150 from a reference surface whose height is zero (0) in the light axis direction. Meanwhile, the shape of the lens may be expressed as a function in which the axial radius x is defined as an independent variable and the step y is defined as a dependent variable, and the molding portion 150 may be expressed as an aspheric equation having a quadratic term as in Equation 1 below, because the molding portion 150 has a shape in which the center thereof is recessed.

$$y = \frac{\frac{x^2}{R}}{1+\sqrt{1-\frac{(1+k)x^2}{R^2}}} + A_2 x^2 + $$

$$A_4 x^4 + A_6 x^6 + A_8 x^8 + A_{10} x^{10} + A_{12} x^{12} + A_{14} x^{14}$$

Equation 1

Here, R is a radius of curvature of the apex, k is a conically curved surface coefficient, and A2, A4, A6, A8, A10, A12, and A14 are aspheric deformation coefficients. At this time, the molding portion 150 is a spherical surface when k=0, a parabolic surface when k=−1, a hyperbolic surface when k<−1, an elongated ellipsoid surface when −1<k<0, and a flat ellipsoid surface when k>0. Meanwhile, when a cone is cut at any angle, a shape of a cut surface has a curve called a conical curve. When the conical curve is rotated about the symmetrical axis, a trajectory of the conical curve becomes a conically curved surface.

Specifically, in an embodiment, R may be 1.140E+01, k may be −6.281E−02, A2 may be 2.519E−01, A4 may be −5.678E−01, A6 may be 6.969E−01, A8 may be −2.915E−01, A10 may be −2.933E−01, A12 may be 3.163E−01, and A14 may be −8.332E−02. However, the present disclosure is not limited to these numerical values, and in other embodiments, the values of R, k, and A2 to A14 may be changed.

Figure 2:
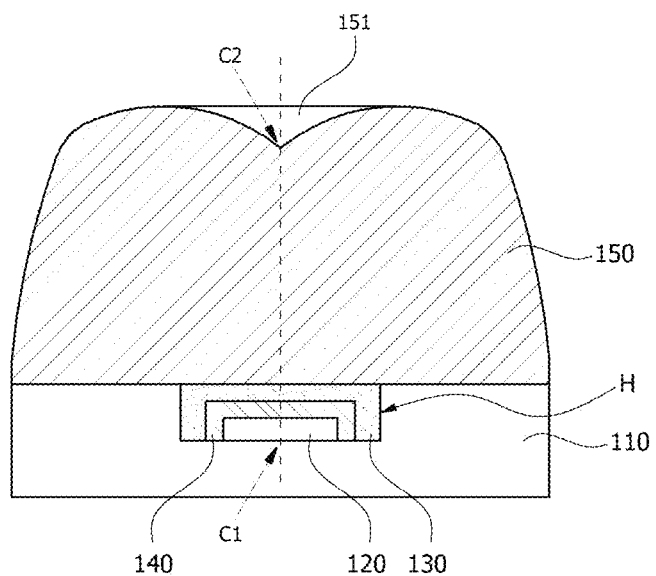
FIG. 2 is a cross sectional view illustrating a light emitting device package according to a second embodiment of the present disclosure.

FIG. 2 is a cross sectional view illustrating a light emitting device package according to a second embodiment of the present disclosure. Specifically, FIG. 2 is a cross sectional view in a direction perpendicular the main surface of the substrate. In the second embodiment, substantially the same portions as the first embodiment described above will be not described.

Referring FIG. 2, the light emitting device package according to the second embodiment of the present disclosure may include a light emitting device 120 disposed in a hole H formed in a substrate 110, a diffusion plate 140 disposed in the hole H to surround the light emitting device 120, a florescent substance layer 130 filling up the hole H, and a molding portion 150 that is disposed on the substrate 110 including the hole H and has a shape of an aspheric lens.

The substrate 110 may be a typical printed circuit board (PCB) or a lead frame, and may be formed of any one of the materials of the first embodiment. Further, the light emitting device 120 may be a device that emits light, such as a light emitting diode (LED). The florescent substance layer 130 may be a layer in which at least one of a red florescent substance, a blue florescent substance, a green florescent substance, or a yellow florescent substance is injected into a transparent resin, such as a silicone resin.

The diffusion plate 140 allows light to be uniformly emitted by scattering and diffusing the light emitted from the light emitting device 120, and may include an opal series diffuser. In addition, the molding portion 150 may have an aspheric shape having a recess 151 at the center thereof as a lens-integrated package that has a function of protecting the light emitting device 120 and a function of a lens, and the center C2 of the molding portion 150 and the center C1 of the light emitting device 120 may be disposed on the same axis.

Figure 3A:
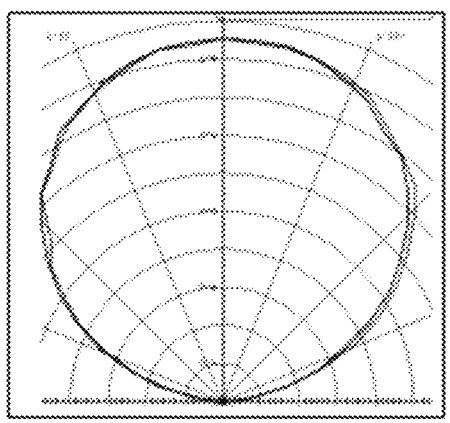
FIG. 3A is a graph showing a distribution pattern of a light emitting device package according to a comparative example.
Figure 3B:
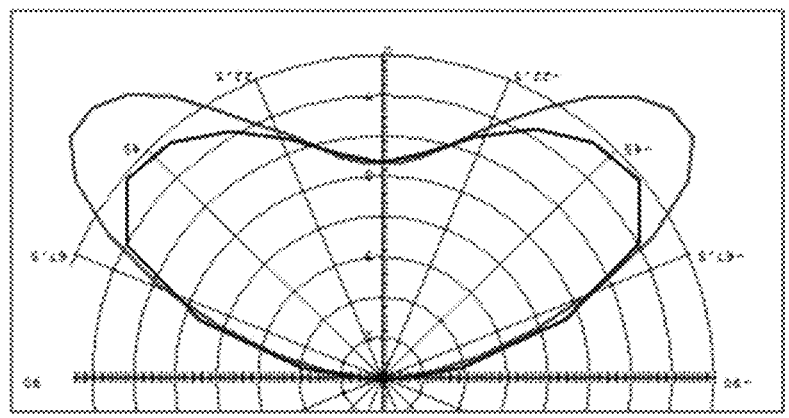
FIG. 3B is a graph showing the distribution pattern of the light emitting device package according to the embodiment of the present disclosure.

FIG. 3A is a graph showing a light distribution pattern of a light emitting device package according to a comparative example, and FIG. 3B is a graph showing the light distribution pattern of the light emitting device package according to the embodiment of the present disclosure.

Referring to FIGS. 3A and 3B, when it is assumed that the light intensity is highest at a center point, a beam angle in the light emitting device package means a range between the points where the light intensity is a half of the highest light intensity. The light emitting device package according to the comparative example does not employ the aspheric lens, and it can be found that the beam angle of the light emitted from the light emitting device is small (see, FIG. 3A). In contrast, the light emitting device package according to the embodiment of the disclosure employs the molding portion having the shape of the aspheric lens whose center is recessed, and it can be found that the beam angle of the light emitted from the light emitting device is dramatically increased (see, FIG. 3B).

Figure 4A:
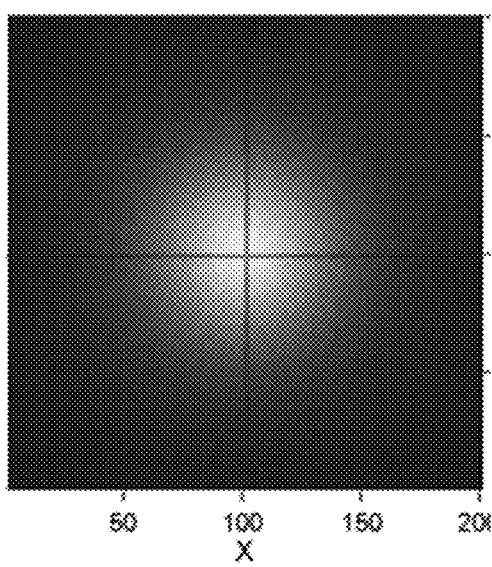
FIG. 4A is a photograph showing an illuminance distribution of the light emitting device package according to the comparative example.
Figure 4A:
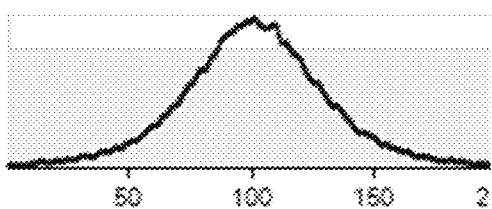
Figure 4B:
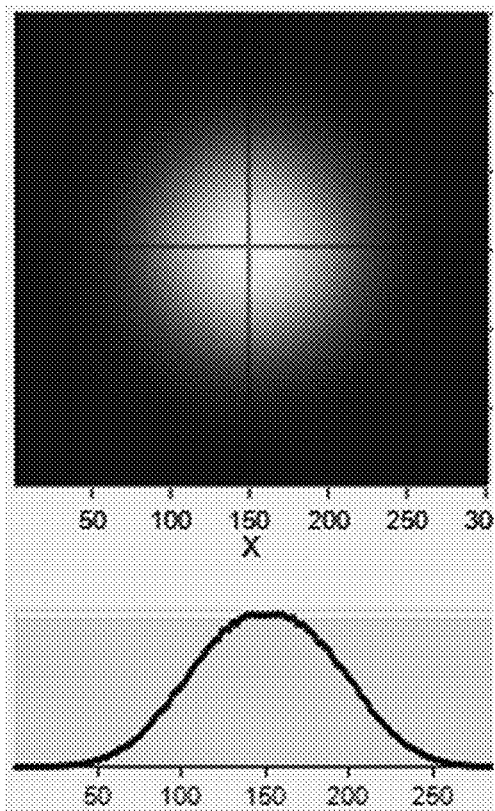
FIG. 4B is a graph showing an illuminance distribution of the light emitting device package according to the embodiment of the present disclosure.

FIG. 4A is a photograph showing an illuminance distribution of the light emitting device package according to the comparative example, and FIG. 4B is a graph showing the illuminance distribution of the light emitting device package according to the embodiment of the present disclosure.

Referring FIGS. 4A and 4B, the light emitting device package according to the comparative example employs no aspheric lens, and it can be found that a diffusion range of the light emitted from the light emitting device is small (see, FIG. 4A). In contrast, the light emitting device package according to the embodiment of the disclosure employs the molding portion having the shape of the aspheric lens whose center is recessed, and it can be found that the diffusion range of the light emitted from the light emitting device is dramatically increased (see, FIG. 4B).

Figure 5A:
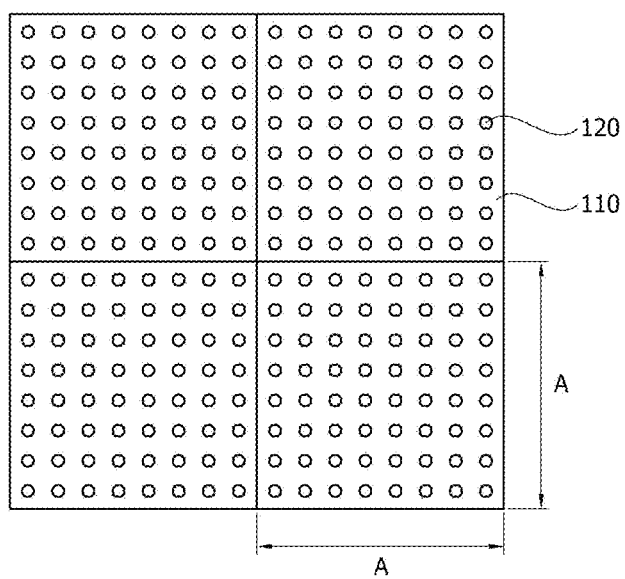
FIG. 5A is a plan view illustrating a flat panel lighting apparatus made up of the light emitting device package according to the comparative example.
Figure 5B:
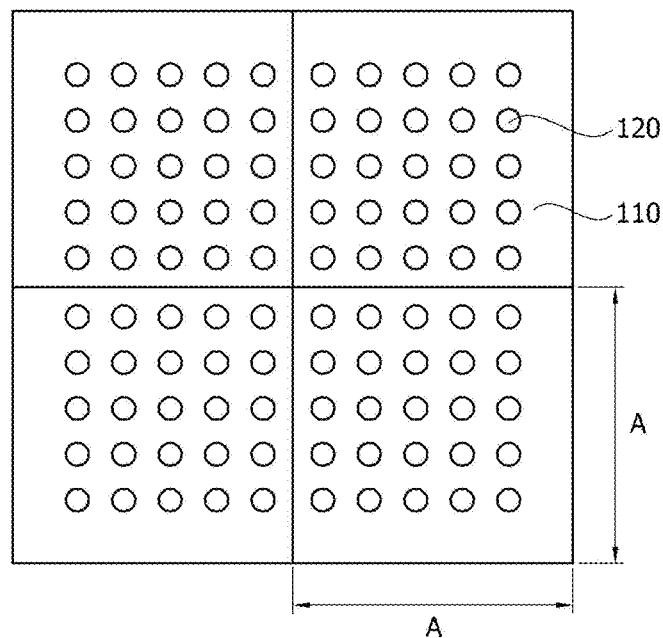
FIG. 5B is a plan view illustrating a flat panel lighting apparatus made up of the light emitting device package according to the embodiment of the present disclosure.

FIG. 5A is a plan view illustrating a flat panel lighting apparatus made up of the light emitting device package according to the comparative example, and FIG. 5B is a plan view illustrating a flat panel lighting apparatus made up of the light emitting device package according to the embodiment of the present disclosure.

Referring FIG. 5A, the light emitting device package according to the comparative example does not employ the aspheric lens. As discussed above, since the diffusion range of the light emitted from the light emitting device is small, when the flat panel lighting apparatus is configured by arranging a plurality of the light emitting devices, a relatively large number of light emitting devices 120 should be disposed on a unit area (A×A) of the substrate 110 in order to be perceived as a surface light source.

Referring FIG. 5B, the light emitting device package according to the embodiment of the present disclosure employs the molding portion having the shape of the aspheric lens whose center is recessed. As discussed above, since the diffusion range of the light emitted from the light emitting device is wide, when the flat panel lighting apparatus is configured by arranging a plurality of the light emitting devices, the flat panel lighting apparatus having the relatively small number of the light emitting devices 120 disposed on the unit area (A×A) of the substrate 110 can be perceived as the surface light source.

According to the light emitting device package and the lighting apparatus including the light emitting device package in the embodiments of the present disclosure described above, the molding portion having the shape of the aspheric lens whose center is recessed and the diffusion plate are employed to widely diffuse the light emitted from the light emitting device. Thereby, the efficiency of light can be increased, and manufacturing time and cost can be reduced. Simultaneously, the yellow ring phenomenon can be avoided.

While the present disclosure have been described with reference to the preferred embodiments of the present disclosure as described above, the present disclosure is not limited to these embodiments. It will be apparent to those skilled in the art that various modifications or alterations can be contrived and implemented within the scope described in the specification, and these modifications and alterations also fall within the technical scope of the present disclosure.

DESCRIPTION OF THE NUMERALS OR SYMBOLS

110: substrate
120: light emitting device
130: florescent substance layer
140: diffusion plate
150: molding portion
151: recess An object of the present disclosure is to provide a light emitting device package that employs a molding portion having a shape of an aspheric lens whose center is recessed and a diffusion plate to cause light emitted from a light emitting device to be widely diffused, thereby reducing manufacturing time and cost and increasing efficiency of the light, and a lighting apparatus including the light emitting device package.

According to an aspect of the present disclosure, there is provided a light emitting device package, which includes: a light emitting device disposed on a substrate; a diffusion plate disposed on the substrate to surround the light emitting device; and a molding portion that is disposed on the substrate including the diffusion plate and has a shape of an aspheric lens whose center is recessed. The center of the molding portion is located on the same axis as the center of the light emitting device, The diffusion plate may be interposed between the light emitting device and the molding portion.

The light emitting device package may further include a florescent substance layer interposed between the light emitting device and the diffusion plate.

A width of a lower end of the molding portion may be wider than a width of an upper end of the molding portion.

The light emitting device may be disposed in a hole formed in the substrate.

The light emitting device package may further include a florescent substance layer that fills-up the hole.

A flange protruding radially outward may be formed on the lower end of the molding portion.

The molding portion may be transparent or semitransparent.

The molding portion may include a silicone resin or an epoxy resin.

The diffusion plate may include an opal series diffuser.

According to another aspect of the present disclosure, there is provided a light emitting device package, which includes: a light emitting device disposed on a substrate; and a molding portion that is disposed on the substrate to mold the light emitting device. The molding portion has a shape of an aspheric lens whose center is recessed and a width of the lower end of the molding portion is wider than a width of an upper end of the molding portion.

The light emitting device package may further include a diffusion plate interposed between the light emitting device and the molding portion.

The light emitting device package may further include a florescent substance layer interposed between the light emitting device and the diffusion plate.

According to yet another aspect of the present disclosure, there is provided a flat panel lighting apparatus including a plurality of light emitting device packages disposed at predetermined intervals. Each of the light emitting device packages includes: a light emitting device disposed on a substrate; and a molding portion disposed on the substrate to mold the light emitting device, wherein the molding portion has a shape of an aspheric lens whose center is recessed and a width of a lower end of the molding portion is wider than a width of an upper end of the molding portion.

According to embodiments of the present disclosure, the molding portion having the shape of the aspheric lens whose center is recessed and the diffusion plate are employed to widely diffuse the light emitted from the light emitting device. Thereby, the efficiency of light can be increased, and manufacturing time and cost can be reduced. Simultaneously, 'a yellow ring phenomenon can be avoided.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a light emitting device disposed on a substrate;
a diffusion plate disposed on the substrate to surround the light emitting device; and
a molding portion that is disposed on the substrate and has a shape of an aspheric lens whose center is recessed,
wherein a width of the substrate is equal to a width of a lower end of the molding portion in at least two regions at a perpendicular direction to an optical axis,
wherein the center of the molding portion is located on the same axis as the center of the light emitting device, and the diffusion plate is interposed between the light emitting device and the molding portion,
wherein the shape of the molding potion is expressed as follows:

$$y = \frac{\frac{x^2}{R}}{1+\sqrt{1-\frac{(1+k)x^2}{R^2}}} + A_2 x^2 + A_4 x^4 + A_6 x^6 + A_8 x^8 + A_{10} x^{10} + A_{12} x^{12} + A_{14} x^{14},$$

and
wherein:
x is an axial radius measured on an axis perpendicular to the optical axis,
y is a step of a lens surface in the axial radius x, the step of the lens surface identifying a height obtained by measuring an apex of a molding portion from a reference surface at a height of zero (0) in a direction of the optical axis,
R is a radius of curvature of the apex,
k is a conically curved surface coefficient, and
A2, A4, A6, A8, A10, A12, and A14 are aspheric deformation coefficients, and
wherein R is 1.140E+01, k is −6.281E−02, A2 is 2.519E−01, A4 is −5.678E−01, A6 is 6.969E−01, A8 is −2.915E−01, A10 is −2.933E−01, A12 is 3.163E−01, and A14 is −8.332E−02.

2. The light emitting device package of claim 1, further comprising a florescent substance layer interposed between the light emitting device and the diffusion plate.

3. The light emitting device package of claim 1, wherein the width of the lower end of the molding portion is wider than a width of an upper end of the molding portion.

4. The light emitting device package of claim 1, wherein the light emitting device is disposed in a hole formed in the substrate.

5. The light emitting device package of claim 4, further comprising a florescent substance layer that fills-up the hole.

6. The light emitting device package of claim 1, wherein a flange protruding radially outward is formed on a lower end of the molding portion.

7. The light emitting device package of claim 1, wherein the molding portion is transparent or semitransparent.

8. The light emitting device package of claim 7, wherein the molding portion includes a silicone resin or an epoxy resin.

9. The light emitting device package of claim 1, wherein the diffusion plate includes an opal series diffuser.

10. A light emitting device package comprising:

a light emitting device disposed on a substrate; and a molding portion disposed on the substrate to mold the light emitting device, wherein the molding portion has a shape of an aspheric lens whose center is recessed and a width of a lower end of the molding portion is wider than a width of an upper end of the molding portion, wherein a width of the substrate is equal to the width of the lower end of the molding portion in at least two regions at a perpendicular direction to an optical axis, wherein the shape of the molding potion is expressed as follows:

$$y = \frac{\frac{x^2}{R}}{1 + \sqrt{1 - \frac{(1+k)x^2}{R^2}}} + A_2 x^2 + A_4 x^4 + A_6 x^6 + A_8 x^8 + A_{10} x^{10} + A_{12} x^{12} + A_{14} x^{14},$$

and wherein:

x is an axial radius measured on an axis perpendicular to the optical axis, y is a step of a lens surface in the axial radius x, the step of the lens surface identifying a height obtained by measuring an apex of a molding portion from a reference surface at a height of zero (0) in a direction of the optical axis, R is a radius of curvature of the apex, k is a conically curved surface coefficient, and A2, A4, A6, A8, A10, A12, and A14 are aspheric deformation coefficients, and wherein R is 1.140E+01, k is −6.281E−02, A2 is 2.519E−01, A4 is −5.678E−01, A6 is 6.969E−01, A8 is −2.915E−01, A10 is −2.933E−01, A12 is 3.163E−01, and A14 is −8.332E−02.

11. The light emitting device package of claim 10, further comprising a diffusion plate interposed between the light emitting device and the molding portion.

12. The light emitting device package of claim 11, further comprising a florescent substance layer interposed between the light emitting device and the diffusion plate.

13. The light emitting device package of claim 1, wherein the shape of the aspherical lens corresponds to an elongated ellipsoidal surface.

* * * * *